(12) United States Patent
Liu

(10) Patent No.: US 10,746,826 B2
(45) Date of Patent: Aug. 18, 2020

(54) SYSTEMS AND METHODS FOR RAMPING DOWN MAGNETIC RESONANCE MAGNET

(71) Applicant: SHANGHAI UNITED IMAGING HEALTHCARE CO., LTD., Shanghai (CN)

(72) Inventor: Jianfeng Liu, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 433 days.

(21) Appl. No.: 15/692,265

(22) Filed: Aug. 31, 2017

(65) Prior Publication Data

US 2019/0004129 A1    Jan. 3, 2019

(30) Foreign Application Priority Data

Jul. 3, 2017   (CN) .......................... 2017 1 0535226

(51) Int. Cl.
| | | |
|---|---|---|
| *G01R 33/3815* | (2006.01) | |
| *C08G 63/79* | (2006.01) | |
| *H01F 6/00* | (2006.01) | |
| *G01R 33/38* | (2006.01) | |

(52) U.S. Cl.
CPC ......... *G01R 33/3815* (2013.01); *C08G 63/79* (2013.01); *H01F 6/006* (2013.01); *H01F 6/008* (2013.01); *G01R 33/3804* (2013.01)

(58) Field of Classification Search
CPC ............ G01R 33/3815; G01R 33/3804; G01R 33/381; H01F 6/006; H01F 6/008; H01F 13/006; H01F 6/00; C08G 63/79

USPC ........................................................ 361/141
See application file for complete search history.

(56) References Cited

U.S. PATENT DOCUMENTS

| | | | |
|---|---|---|---|
| 4,763,221 A | 8/1988 | Standridge | |
| 2006/0176132 A1 | 8/2006 | Atkins et al. | |

FOREIGN PATENT DOCUMENTS

| | | |
|---|---|---|
| CN | 1956118 A | 5/2007 |
| CN | 101714864 A | 5/2010 |
| CN | 102054623 A | 5/2011 |
| CN | 103022972 A | 4/2013 |
| CN | 106098291 A | 11/2016 |
| CN | 106872919 A | 6/2017 |
| CN | 107123504 A | 9/2017 |
| DE | 102015216882 A1 | 3/2017 |

(Continued)

OTHER PUBLICATIONS

WO-2014/049501; Figures and specification (Year: 2014).*

(Continued)

*Primary Examiner* — Dharti H Patel
(74) *Attorney, Agent, or Firm* — Metis IP LLC

(57) ABSTRACT

A magnetic resonance system may include a magnetic resonance magnet and a storage container configured to accommodate the magnetic resonance magnet. The storage container may also contain an endothermic liquid. The magnetic resonance system may further include a ramping-down device configured to trigger releasing electric energy by the magnetic resonance magnet. The first ramping-down device may include an electric energy consumption device configured to consume at least a portion of the released electric energy by the magnetic resonance magnet.

17 Claims, 1 Drawing Sheet

(56) References Cited

FOREIGN PATENT DOCUMENTS

JP        S62244110  A     10/1987
WO      2014049501 A1     4/2014

OTHER PUBLICATIONS

European Search report in European Application No. 17204397.8 dated Jun. 6, 2018, 10 pages.
Chunyan Cui et al.: "Performance Test of Superconducting Switch for NMR Magnet", IEEE Transactions on Applied Superconductivity, IEEE Service Center, Los Alamitos,CA,US vol. 22, No. 3, Jun. 1, 2012 (Jun. 1, 2012), p. 9502004, XP011446667, ISSN: 1051-8223, DOI:10.1109/TASC.2011.2179382.
International Search Report in International Application No. PCT/CN2017/114134 dated Apr. 8, 2018, 4 pages.
Written Opinion in International Application No. PCT/CN2017/114134 dated Apr. 8, 2018, 5 pages.

\* cited by examiner

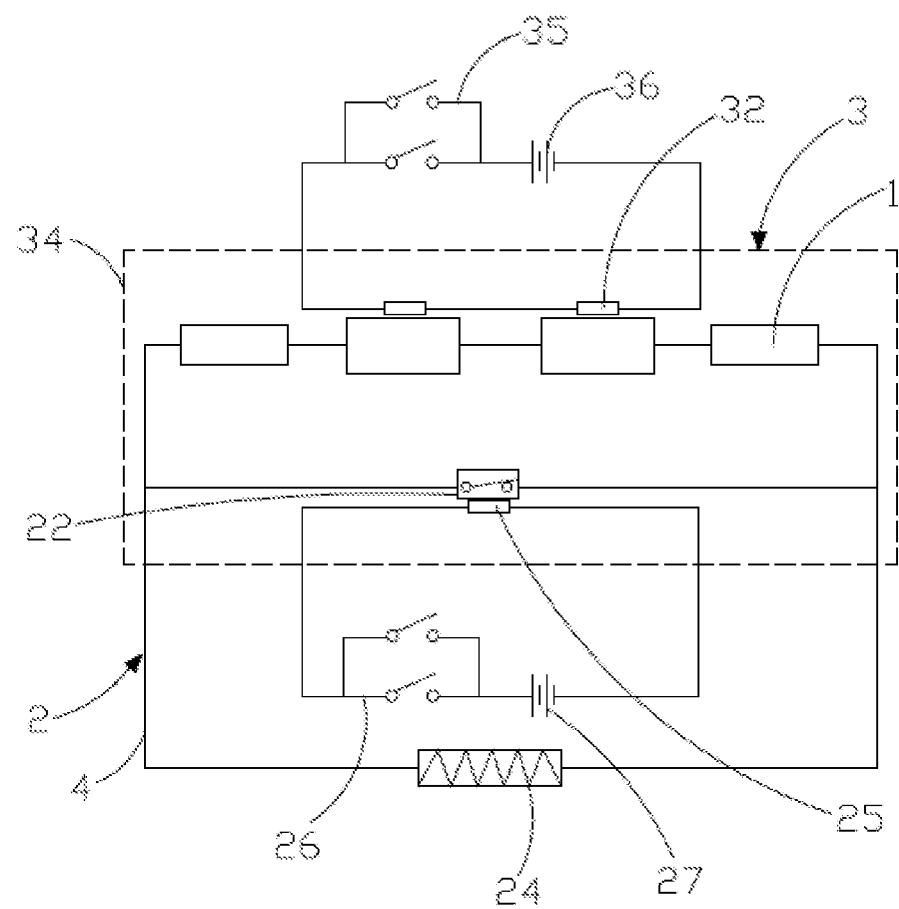

SYSTEMS AND METHODS FOR RAMPING DOWN MAGNETIC RESONANCE MAGNET

CROSS REFERENCE

This application claims priority of Chinese Patent Application No. 201710535226.5 filed on Jul. 3, 2017, the entire contents of which are hereby incorporated by reference.

TECHNICAL FIELD

The present disclosure generally relates to systems and methods for magnetic resonance, and more specifically relates to methods and systems for ramping down in magnetic resonance system.

BACKGROUND

The magnetic resonance imaging (MRI) system in clinical is categorized according to the type of the magnet (e.g., permanent magnet, superconducting magnet). The superconducting magnet has high magnetic field intensity (usually 1.5 or 3 Tesla). The superconducting magnet may attract ferromagnetic materials nearby, and the attracted ferromagnetic material can be taken down only after the superconducting magnet is ramped down (e.g., by ramping down the superconducting magnet). According to some regulations and laws, a ramping-down switch (or ramping-down circuit) is required to ramp down the superconducting magnet in an emergency. When metal tools, a patient with a metal implant or heart pacemaker close to the MRI system, the superconducting magnet may be ramped down in a short time (usually 20 seconds) by turning on the ramping-down switch.

When turning on the ramping-down switch, a heater may heat a superconducting coil, then the superconducting coil may be ramped down and reverts to a resistive state, and the electric current flowing through the resistive part of the superconducting coil may be consumed in about 20 seconds and converted into a large amount of Joule heat. The superconducting coil may usually be soaked in liquid helium in a cryogenic container. The Joule heat would lead to the bulk of liquid helium volatilized. After superconducting magnet is ramped down, the liquid helium need to be added to convert the superconducting magnet into superconducting state, and adding the liquid helium would bring huge cost.

SUMMARY

According to an aspect of the present disclosure, a magnetic resonance system may include a magnetic resonance magnet; a storage container configured to contain the magnetic resonance magnet and an endothermic liquid; and a first ramping-down device configured to trigger releasing electric energy from the magnetic resonance magnet, the first ramping-down device including an electric energy consumption device configured to consume at least a portion of the released electric energy by the magnetic resonance magnet.

In some embodiments, the first ramping-down device may include a superconductor electrically coupled to the magnetic resonance magnet, the electric energy consumption device being electrically connected to the superconductor; and a first heater configured to heat the superconductor; wherein when the first heater increases a temperature of the superconductor, the superconductor is disconnected, or the superconductor loses a superconduct condition, and the magnetic resonance magnet releases the electric energy, and the electric energy consumption device is configured to consume the electric energy released by the magnetic resonance magnet.

In some embodiments, the magnetic resonance magnet may include a superconducting coil.

In some embodiments, the magnetic resonance magnet may include a second ramping-down device configured to increase a temperature of the magnetic resonance magnet.

In some embodiments, the second ramping-down device may include a second heater in the storage container, the second heater being configured to increase the temperature of the magnetic resonance magnet.

In some embodiments, the first heater and the superconductor may be within the storage container.

In some embodiments, the superconductor may include a superconducting switch.

In some embodiments, the first ramping-down device may include a superconducting switch, wherein the superconducting switch is a mechanical switch and connected to the magnetic resonance magnet, the electric energy consumption device is connected to the superconducting switch, and the electric energy consumption device is configured to consume the electric energy released by the magnetic resonance magnet when the superconducting switch is turned off.

In some embodiments, a resistance value of the electric energy consumption device may be less than a resistance value of the magnetic resonance magnet in a non-superconducting state.

In some embodiments, a resistance value of the electric energy consumption device may be less than a resistance value of the superconductor in a non-superconducting state.

According to another aspect of the present disclosure, a method for ramping down a magnetic resonance magnet contained in a storage container, the storage container containing an endothermic liquid, the method may include ramping down the magnetic resonance magnet in a first mode, the first mode may include: heating, by a first heater, a superconductor electrically coupled to the magnetic resonance magnet, wherein when the first heater increases a temperature of the superconductor by heating the superconductor, the superconductor is disconnected to the magnetic resonance magnet or resistance of the superconductor increases; releasing, from the magnetic resonance magnet, electric energy when the superconductor is disconnected to the magnetic resonance magnet or the superconductor loses a superconduct condition; and consuming, by an electric energy consumption device residing outside the storage container, the electric energy released from the magnetic resonance magnet, thereby ramping down the magnetic resonance magnet. In some embodiments, the method may further include: obtaining an environmental condition related to the magnetic resonance magnet; determining whether the environmental condition related to the magnetic resonance magnet satisfies a first condition; and ramping down the magnetic resonance magnet in the first mode in response to a result of the determination that the environmental condition related to the magnetic resonance magnet satisfies the first condition.

In some embodiments, the method may further include: determining whether the environmental condition related to the magnetic resonance magnet satisfies a second condition; and ramping down the magnetic resonance magnet in a second mode in response to a result of the determination that the environmental condition related to the magnetic resonance magnet satisfies the second condition, the second mode being different from the first mode.

In some embodiments, a ramping down speed of the second mode may be faster than that of the first mode.

In some embodiments, the second mode may include: heating, by a second heater, a temperature of the magnetic resonance magnet, the second heater being inside the storage container; releasing, by the magnetic resonance magnet, energy when the magnetic resonance magnet is being heated by the second heater, thereby ramping down the magnetic resonance magnet; and absorbing, by the endothermic liquid contained in the storage container, heat caused by the released energy from the magnetic resonance magnet.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 1 is a schematic diagram illustrating magnet ramping-down system in an MRI system according to some embodiments of the present disclosure.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, section or assembly of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an erasable programmable read-only memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

In the present disclosure, the term "ramp down" "ramping-down" or "ramping down process" may refer to a process or an action decreasing the magnetic field intensity of a magnetic resonance magnet from a first level to a second level. In some embodiments, the first level (e.g., 1.5T, 3T, etc.) may be higher than the second level (e.g., 0.1 Gs, 10 Gs, 100 Gs, 1000 Gs, etc.)

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for illustration and description only and are not intended to limit the scope of the present disclosure. It is understood that the drawings are not to scale.

FIG. 1 illustrates a magnetic resonance system according to some embodiments of the present disclosure. The magnetic resonance system may include a magnetic resonance magnet 1, a storage container 34, a first ramping-down device 2, a second ramping-down device 3 configured to ramp down the magnetic resonance magnet 1. When being activated, the second ramping-down device 3 may be configured to ramp down the magnetic resonance magnet 1.

The magnetic resonance magnet 1 may include a superconducting coil group. The storage container 34 may be configured to contain the magnetic resonance magnet 1. The storage container 34 may also contain endothermic liquid (e.g., cryogenic liquid, such as liquid helium or liquid nitrogen, etc.). The endothermic liquid at an extremely low temperature (e.g., about −269 degrees Celsius.) may be used to maintain the magnetic resonance magnet 1 in a superconducting state. The resistance value of the magnetic resonance magnet 1 in the superconducting state may be or close to zero. An electric current may flow through the magnetic resonance magnet 1 (e.g., the superconducting coil group), generating a magnetic field. Since resistance value of the magnetic resonance magnet 1 in the superconducting state may be or close to zero, the electric current may continuously flow in the superconducting coil group without any consumption In such case, the electric energy of the electric current may remain in the magnetic resonance magnet 1, and the magnetic field may be generated while the magnetic resonance magnet 1 remains in the superconducting state. In some embodiments, increasing the temperature of the magnetic resonance magnet 1 may render the magnetic resonance magnet 1 to change from the superconducting state to a resistive state. The resistance value of the magnetic resonance magnet 1 in the resistive state may be much greater than zero, and the magnetic resonance magnet 1 may become a resistor. The electric energy may be consumed by the resistor of magnetic resonance magnet 1, producing Joule heat. In some embodiments, the endothermic liquid, which surrounds the magnetic resonance magnet 1, may absorb the Joule heat produced by the magnetic resonance magnet 1.

The first ramping-down device 2, when being activated, may be configured to ramping down the magnetic resonance magnet 1. In some embodiments, the first ramping-down device 2 may be configured to ramp down the magnetic resonance magnet 1 by consuming the electric energy of magnetic resonance magnet 1 by an electrical device that resides outside the storage container (e.g., by an external electric energy consumption device 24). The first ramping-down device 2 may include a superconductor 22, an external electric energy consumption device 24, and a first heater 25. The superconductor 22 may be coupled to the magnetic resonance magnet 1 mechanically or electrically. Heating the superconductor 22 may change the initial superconducting state of the superconductor 22 into the resistive state. For example, the superconductor may lose the initial superconducting state when the temperature of the superconductor rises for 1-2 Kelvin. The first heater 25 may be configured to heat the superconductor such that the superconductor changes from its superconducting state to a resistive state.

The external electric energy consumption device 24 may be connected with the superconductor 22 and reside outside of the storage container 34. The first heater 25 may be configured to heat the superconductor 22. When the first heater 25 heats the superconductor 22, the resistance value of the superconductor 22 may increase, or the superconductor 22 may be disconnected. As such the magnetic resonance magnet 1 and the external electric energy consumption device 24 may form a circuit. Accordingly, when the first heater 25 heats the superconductor 22, the external electric energy consumption device 24 may consume the electric energy of the magnetic resonance magnet 1. In some embodiments, the resistance value of the external electric energy consumption device 24 may be less than the resistance value of the magnetic resonance magnet 1 in a non-superconducting state (e.g., the resistive state). In some embodiments, the resistance value of the external electric energy consumption device 24 may be less than the resistance value of the superconducting coil group (e.g., the magnetic resonance magnet 1) in the non-superconducting state (e.g., the resistive state). For example, the resistance value of the external electric energy consumption device 24 may be 10Ω and the resistance value of the superconducting coil group in the resistive state may be 100Ω. In some embodiments, the resistance value of the external electric energy consumption device 24 may be less than the resistance value of the superconductor 22 in the non-superconducting state (e.g., the resistive state).

In some embodiments, the superconductor 22 and the superconducting coil group (e.g., the magnetic resonance magnet 1) may form a circuit when the superconductor 22 is connected to the superconducting coil group (e.g., the magnetic resonance magnet 1). The superconductor 22 may lose superconductivity and be converted into a resistor having a large resistance value when the first heater 25 heats the superconductor 22. Then the superconductor 22 and the external electric energy consumption device 24 may form a parallel circuit using the superconducting coil group as a power source. Since the superconductor 22 has a large resistance value when converted into a resistor, the electric energy in the superconducting coil group may be consumed when flowing through the external electric energy consumption device 24. In some embodiments, the superconductor 22 may be a superconducting switch. The superconducting switch may store less electric energy, while the superconducting coil group may store much more electric energy. Thus, the superconducting switch would not generate much heat when the superconductor 22 is converted into a resistor. Most of the electric energy in the circuit formed by the superconductor switch and the superconducting coil group when the superconductor switch is turned on (e.g., the superconductor switch is heated and converted into a resistor) may be consumed by the external electric energy consumption device 24, instead of the superconductor switch. In some embodiments, the superconductor 22 may be any type of superconducting devices storing less electric energy.

In some embodiments, the first ramping-down device 2 may include a first ramping-down switch group 26 and a first power source 27. The first ramping-down switch group 26, the first power source 27, and the first heater 25 may be connected in series forming a circuit. When the first ramping-down switch group 26 is closed, the first power source 27 may supply power to the first heater 25; then the first heater 25 may generate heat and heat the superconductor 22. The first ramping-down switch group 26 may include one switch or at least two switches connected in parallel. The at least two switches may be installed at different positions in an MRI scanning room and/or an MRI operating room, and people regardless of his or her position may operate the first ramping-down switch group 26 to control the first ramping-down device 2 (by, example, closing one of the two switches).

In some embodiments, the external electric energy consumption device 24 may include a plurality of power diodes connected in series or parallel. Preferably, a heat sink (not shown in FIG. 1), which may be configured to dissipate heat generated by the external electric energy consumption device 24, may be placed on the external electric energy consumption device 24. More preferably, the external electric energy consumption device 24 may be placed in a medium having a high specific heat capacity, such as paraffin. The paraffin may solidify at room temperature and may absorb much heat when melting, thus ensuring the external electric energy consumption device 24 maintaining at a low temperature. In some embodiments, the external electric energy consumption device 24, the superconductor 22, and the magnetic resonance magnet 1 may be connected by a superconducting wire 4 to avoid energy consumption by common wire, which may be damaged after being heated.

In some embodiments, the external electric energy consumption device 24 may have a function of clamping pressure. The voltages of both ends of the external electric energy consumption device 24 may be not higher than a threshold voltage (e.g., 10V) when the electric current flows through external electric energy consumption device 24. In this way, the superconductor 22 may not be burnt out, and the consumption speed of the electric current of the magnetic resonance magnet 1 may get controlled.

In some embodiments, the second ramping-down device 3 may include a second heater 32 contained in the storage container 34. The second heater 32 may be configured to heat the magnetic resonance magnet 1. The superconducting coil group (i.e., the magnetic resonance magnet 1) may lose superconductivity (e.g., converted into the resistive state) and be converted into a resistor having a large resistance value when the second heater 32 heats the magnetic resonance magnet 1. The electric current stored in the superconducting coil group may be consumed in a short time. A great amount of heat may be generated while the electric current becomes or is close to zero, and a large amount of the endothermic liquid (e.g., liquid helium, liquid nitrogen, etc.) surrounding the superconducting coil group may be volatilized due to the absorption of the heat.

The first ramping-down device 2 may consume the electric energy stored in the superconducting coil group via the external electric energy consumption device 24. Since the resistance value of the external electric energy consumption device 24 may be much less than that of the superconducting coil group when the superconducting coil group loses its superconductivity, the speed of the external electric energy consumption device 24 to consume electric energy may be less than the speed of the superconducting coil group to consume electric energy when the superconducting coil group loses its superconductivity (e.g., being converted into a resistive state). In addition, the time for the external electric energy consumption device 24 to completely consume the electric energy of the superconducting coil group such that the electric energy of the superconducting coil group becomes zero may be longer than the time for the superconducting coil group consumes its electric energy into zero directly (e.g., by releasing a great amount of heat). Therefore, the ramping down speed of the first ramping-down device 2 may be slower than that of the second ramping-down device 3. When the magnetic resonance magnet 1 is ramped down by the first ramping-down device 2, the superconducting coil group may not generate heat, thereby reducing the consumption of the liquid helium. In some embodiments, the second ramping-down device 3 may include a plurality of the second heater 32, and each of the second heater 32 may heat different superconducting coil groups. Alternatively, the second ramping-down device 3 may include one-second heater 32, and the one-second heater 32 may heat different superconducting coil groups simultaneously.

Preferably, both the first heater 25 and the superconductor 22 may be contained in the storage container 34, thus the heat generated by the first heater 25 and the superconductor 22 may be absorbed by the endothermic liquid (e.g., liquid helium, liquid nitrogen, etc.) stored in the storage container 34 and may not conduct to an MRI device.

In some embodiments, the second ramping-down device 3 may further include a second ramping-down switch group 35 and a second power source 36. The second ramping-down switch group 35, the second power source 36, and the second heater 32 may be connected in series to form a circuit. When the second ramping-down switch group 35 is closed, the second power source 36 may supply power to the second heater 32. The second heater 32 may generate heat and heat the superconductor 22. The second ramping-down switch group 35 may include one switch or at least two switches connected in parallel. The at least two switches may be installed at different positions in the MRI scanning room and/or the MRI operation room, and people regardless of his or her position may operate the second ramping-down switch group 35 to control the second ramping-down device 3 (by, example, closing one of the two switches). In some embodiments, the first ramping-down device 2 and the second ramping-down device 3 may ramp down the magnetic resonance magnet 1 simultaneously.

In some embodiments, the first ramping-down device may implement a mechanical superconducting switch instead of the heating superconductor to cause the electric energy of the magnetic resonance magnet flowing to the external electric energy consumption device 24. The mechanical switch may be connected to the magnetic resonance magnet, and the external electric energy consumption device may be connected to the superconducting switch. When ramping-down is required, disconnecting the superconducting switch from the circuit of the superconducting switch may cause the magnetic resonance magnet 1 and the external electric energy consumption device 24 to form a circuit. As such, the external electric energy consumption device 24 may consume the electric energy of the magnetic resonance magnet, and ramping down effect similar to the way of heating the superconductor may be achieved.

The present disclosure also provides a method of ramping down the magnetic resonance magnet using a first ramping-down mode, or a second ramping-down mode, or both modes. In a first ramping-down mode, the electric energy of the magnetic resonance magnet 1 may be released and consumed by the electric energy consumption device 24. In a second ramping-down mode, electric energy of the magnetic resonance magnet 1 may be converted to heat and consumed by the endothermic liquid surrounding the magnetic resonance magnet 1. The ramping-down speed of the first ramping-down mode implemented by the first ramping-down device 2 may be slower than the ramping-down speed of the second ramping-down mode implemented by the second ramping-down device 3. The cost (e.g., liquid volatilization) of the first ramping-down mode implemented by the first ramping-down device 2 may be lower than the cost of the second ramping-down mode implemented by the second ramping-down device 3. In some embodiments, one of the first ramping-down mode or the second ramping-down mode may be selected to ramp down the magnetic resonance magnet 1 according to the need. In some embodiments, the first ramping-down device 2 may be operated to implement the first ramping-down mode by a hospital technician instead of a service engineer or a field engineer. In some embodiments, the first and second ramping-down modes may be used simultaneously to ramp down the magnetic resonance magnet 1.

In some embodiments, the first ramping-down mode may use the first ramping-down device 2 to ramp down the magnetic resonance magnet 1. The first ramping-down device 2 may trigger releasing the electric energy by the magnetic resonance magnet 1 in a storage container 34. The first ram ping-down mode may include heating, by a first heater 25, a superconductor electrically coupled to the magnetic resonance magnet 1. When the first heater 25 increases a temperature of the superconductor by heating the superconductor, the superconductor is disconnected to the magnetic resonance magnet or resistance value of the superconductor increases. The first ramping-down mode may also include releasing, by the magnetic resonance magnet 1, electric energy when the superconductor is disconnected to the magnetic resonance magnet 1 or resistance value of the superconductor increases. The first ramping-down mode may further include consuming the electric energy released by the magnetic resonance magnet 1 by the electric energy consumption device 24, thereby ramping down the magnetic resonance magnet 1. In some embodiments, the electric energy consumption device 24 may reside outside the storage container 34. In the first ramping-down mode, the superconductor 22 coupled to the magnetic resonance magnet 1 may be heated by a first heater 25. When the superconductor 22 is heated, it may lose its superconductivity and may be disconnected to the magnetic resonance magnet 1 or the resistance of the superconductor 22 may increase and lose a superconduct condition. The magnetic resonance magnet 1 and the electric energy consumption device 24 may form a circuit. Then the electric energy of the magnetic resonance magnet 1 may release to the electric energy consumption device 24. The electric energy consumption device 24 residing outside the storage container 34 may consume the electric energy released by the magnetic resonance magnet 1, thereby the magnetic resonance magnet may be ramped down. In some embodiments, the first heater 25 and the superconductor 22 may be inside the storage container 34. In some embodiments, the resistance value of the external electric energy consumption device 24 may be less than the resistance value of the magnetic resonance magnet 1 in a non-superconducting state (e.g., the resistive state). In some embodiments, the resistance value of the external electric energy consumption device 24 may be less than the resistance value of the superconductor 22 in the non-superconducting state (e.g., the resistive state).

In some embodiments, the second ramping-down mode may use the second ramping-down device 3 to ramp down the magnetic resonance magnet 1. The second ramping-down mode may include heating, by a second heater 32, a temperature of the magnetic resonance magnet. The second heater 32 may reside inside the storage container 34. The second ramping-down mode may include releasing energy by the magnetic resonance magnet 1 when the magnetic resonance magnet 1 is heated by the second heater 32, thereby ramping down the magnetic resonance. The second ramping-down mode may further include absorbing the heat caused by the released energy from the magnetic resonance magnet by the endothermic liquid contained in the storage container 34. In the second ramping-down mode, the second heater 32 located in the storage container 34 may heat the magnetic resonance magnet, then the magnetic resonance magnet 1 may convert from a superconducting state into a resistive state. The magnetic resonance magnet 1 in the resistive state may release its electric energy by converting the electric energy into Joule heat, and the Joule heat may be absorbed by the endothermic liquid contained in the storage container 34.

In some embodiments, the method of ramping down the magnetic resonance magnet 1 may also include selecting one of the first ramping-down mode and a second ramping-down mode. The first and second ramping-down modes may have different ramping down speeds. In addition, the time to ramp down may be longer under the first ramping-down mode than that under the second ramping-down mode. In some embodiments, the method may include selecting one of the two ramping-down modes according to an environmental condition. For example, if an environmental condition requires a shorter period of ramping down, the second ramping-down mode may be selected for ramping down the magnetic resonance magnet 1. In some embodiments, a processor may receive a signal or data related to the environmental conditions (e.g., signal from a sensor related to a temperature of the MRI scanning room of the a temperature of the magnetic resonance magnet). The processor may determine whether the environmental condition satisfies a first condition or a second condition. In response to a result of the determination that the environmental condition related to the magnetic resonance magnet satisfies the first condition, the processor may generate a control signal to cause the first ramping-down device 2 to ramp down the magnetic resonance magnet in the first ramping-down mode. In response to a result of the determination that the environmental condition related to the magnetic resonance magnet satisfies the second condition, the processor may generate a control signal to cause the second ramping-down device 3 to ramp down the magnetic resonance magnet in the second ramping-down mode. In some embodiments, the first and second ramping-down modes may be used simultaneously to ramp down the magnetic resonance magnet 1. For example, the processor may generate one or more control signals to cause the first ramping-down device 2 and the second ramping-down device 3 to ramp down the magnetic resonance magnet at the same time.

In some embodiments, the processor may execute computer instructions (e.g., program code) stored in a storage device (e.g., memory, a hard drive, a solid-state drive, a cloud-based storage) and perform functions thereof in accordance with techniques described herein. The computer instructions may include, for example, routines, programs, objects, components, data structures, procedures, modules, and functions, which perform particular functions described herein. The processor may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

In some embodiments, the method of ramping down the magnetic resonance magnet 1 may further include determining whether the environmental condition satisfies a first condition and ramping down the magnetic resonance magnet 1 in the first ramping-down mode or the second ramping-down mode according to a result of the determination. For example, the first condition may be whether the magnetic resonance magnet can be ramped down in a long period (e.g., above 20 seconds). The environmental condition related to a magnetic resonance may be a ferrous object or material (e.g., a coin, a wheelchair) attached to the magnetic resonance magnet 1 and cannot be removed due to the magnetic field force. The system may determine that the environmental condition satisfies the first condition since the magnetic resonance magnet 1 can be ramped down in a long period. The system may also ramp down the the magnetic resonance magnet 1 using the first ramping-down mode. In some embodiments, the environmental condition may be obtained one or more sensors in the MRI scanning room (placed on the MRI system). Alternatively or additionally, an operator on-site may enter the environmental condition to the system, based on which the system may respond accordingly.

In some embodiments, the method of ramping down the magnetic resonance magnet 1 may also include determining whether the environmental condition satisfies a second condition and ramping down the magnetic resonance magnet 1 in the second ramping-down mode according to a result of the determination that the environmental condition satisfies a second condition. For example, the second condition may be that the magnetic resonance magnet 1 must be ramp down within a short period (e.g., 10 seconds). Merely by way of example, the environmental condition may be that a fire breaks out in the MRI scanning room. The system may determine whether this fire condition satisfies the second condition (i.e., the magnetic resonance magnet 1 must be ramp down d within a short period). If so, the system may use the second ramping-down mode to ramp down the the magnetic resonance magnet 1 since the magnetic resonance magnet 1 may need to be quickly ramped down so that ferrous fire extinguish tools may be able to enter and be used in the MRI scanning room. In some embodiments, the environmental condition may be obtained one or more sensors in the MRI scanning room (placed on the MRI system). Alternatively or additionally, an operator on-site may enter the environmental condition to the system, based on which the system may response accordingly.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, FIGURE, or description thereof to streamline the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

I claim:

1. A magnetic resonance system, comprising:
   a magnetic resonance magnet;
   a storage container configured to contain the magnetic resonance magnet and an endothermic liquid;
   a first ramping-down device configured to trigger releasing electric energy from the magnetic resonance magnet, the first ramping-down device including an electric energy consumption device configured to consume at least a portion of the released electric energy by the magnetic resonance magnet; and
   a second ramping-down device configured to increase a temperature of the magnetic resonance magnet.

2. The magnetic resonance system of claim 1, wherein the first ramping-down device further includes:
   a superconductor electrically coupled to the magnetic resonance magnet, the electric energy consumption device being electrically connected to the superconductor; and
   a first heater configured to heat the superconductor, wherein
   when the first heater heats the superconductor, the superconductor is disconnected or loses a superconduct condition, and the magnetic resonance magnet releases the electric energy, and
   the electric energy consumption device consumes the electric energy released by the magnetic resonance magnet.

3. The magnetic resonance system of claim 2, wherein the first heater and the superconductor are within the storage container.

4. The magnetic resonance system of claim 2, wherein the superconductor includes a superconducting switch.

5. The magnetic resonance system of claim 2, wherein a resistance value of the electric energy consumption device may be less than a resistance value of the magnetic resonance magnet in a non-superconducting state.

6. The magnetic resonance system of claim 2, wherein a resistance value of the electric energy consumption device may he less than a resistance value of the superconductor in a non-superconducting state.

7. The magnetic resonance system of claim 1, wherein the magnetic resonance magnet includes a superconducting coil.

8. The magnetic resonance system of claim 1, wherein the second ramping-down device further includes a second heater in the storage container, the second heater being configured to increase the temperature of the magnetic resonance magnet.

9. The magnetic resonance system of claim 1, wherein the first ramping-down device includes a superconducting switch, wherein
- the superconducting switch is a mechanical switch and connected to the magnetic resonance magnet,
- the electric energy consumption device is connected to the superconducting switch, and
- the electric energy consumption device is configured to consume the electric energy released by the magnetic resonance magnet when the superconducting switch is turned off.

10. A method for ramping down a magnetic resonance magnet contained in a storage container, the storage container containing an endothermic liquid, the method comprising:
- obtaining an environmental condition related to the magnetic resonance magnet;
- determining whether the environmental condition related to the magnetic resonance magnet satisfies a first condition;
- ramping down the magnetic resonance magnet in a first mode in response to a result of the determination that the environmental condition related to the magnetic resonance magnet satisfies the first condition, the first mode including:
  - heating, by a first heater, a superconductor electrically coupled to the magnetic resonance magnet, wherein when the first heater increases a temperature of the superconductor by heating the superconductor, the superconductor is disconnected to the magnetic resonance magnet or the superconductor loses a superconduct condition;
  - consuming electric energy from the magnetic resonance magnet, by an electric energy consumption device residing outside the storage container, when the superconductor is disconnected to the magnetic resonance magnet or the superconductor loses the superconduct condition, thereby ramping down the magnetic resonance magnet;
- determining whether the environmental condition related to the magnetic resonance magnet satisfies a second condition; and
- ramping down the magnetic resonance magnet in a second mode in response to a result of the determination that the environmental condition related to the magnetic resonance magnet satisfies the second condition. the second mode being different from the first mode.

11. The method of claim 10, wherein a ramping down speed of the second mode is faster than that of the first mode.

12. The method of claim 10, wherein the second mode includes:
- heating, by a second heater, a temperature of the magnetic resonance magnet, the second heater being inside the storage container;
- releasing, by the magnetic resonance magnet, energy when the magnetic resonance magnet is being heated by the second heater, thereby ramping down the magnetic resonance magnet; and
- absorbing, by the endothermic liquid contained in the storage container, heat caused by the released energy from the magnetic resonance magnet.

13. The method of claim 10, wherein the magnetic resonancemagnet is a superconducting coil.

14. The method of claim 10, wherein the first heater and the superconductor are inside the storage container.

15. The method of claim 10, wherein the superconductor is a superconducting switch.

16. The method of claim 10, wherein a resistance value of the electric energy consumption device is less than a resistance value of the magnetic resonance magnet in a non-superconducting state.

17. The method of claim 10, wherein a resistance value of the electric energy consumption device is less than a resistance value of the superconductor in a non-superconducting state.

* * * * *